United States Patent
Kim et al.

(10) Patent No.: US 7,816,680 B2
(45) Date of Patent: Oct. 19, 2010

(54) OXIDE SEMICONDUCTORS AND THIN FILM TRANSISTORS COMPRISING THE SAME

(75) Inventors: Chang-jung Kim, Yongin-si (KR); Sang-wook Kim, Yongin-si (KR); Sun-il Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/213,399

(22) Filed: Jun. 19, 2008

(65) Prior Publication Data

US 2009/0294764 A1    Dec. 3, 2009

(30) Foreign Application Priority Data

May 29, 2008    (KR) .................. 10-2008-0050466

(51) Int. Cl.
     *H01L 29/12*    (2006.01)
(52) U.S. Cl. .............. 257/43; 257/72; 257/64; 257/75; 257/65; 257/66; 257/70
(58) Field of Classification Search .......... 257/43, 257/72, 64, 75, 65, 66, 70
See application file for complete search history.

(56) References Cited

U.S. PATENT DOCUMENTS

| | | | |
|---|---|---|---|
| 4,960,718 A | 10/1990 | Aina | |
| 5,337,274 A | 8/1994 | Ohji | |
| 5,656,824 A | 8/1997 | den Boer et al. | |
| 5,854,139 A | 12/1998 | Aratani et al. | |
| 6,458,636 B1 | 10/2002 | Yi et al. | |
| 6,552,387 B1 | 4/2003 | Eitan | |
| 6,562,491 B1 | 5/2003 | Jeon | |
| 6,563,174 B2 | 5/2003 | Kawasaki et al. | |
| 6,727,522 B1 | 4/2004 | Kawasaki et al. | |

(Continued)

FOREIGN PATENT DOCUMENTS

EP    1 737 044    12/2006

(Continued)

OTHER PUBLICATIONS

International Search Report dated Dec. 19, 2008 for International Application No. PCT/KR2008/003471.

(Continued)

*Primary Examiner*—Long Pham
(74) *Attorney, Agent, or Firm*—Harness, Dickey & Pierce, P.L.C.

(57) ABSTRACT

Provided are oxide semiconductors and thin film transistors of the same. An oxide semiconductor includes Zn, In and Hf. The amount of Hf is in the range of about 2-16 at %, inclusive, based on the total amount of Zn, In, and Hf. A thin film transistor includes a gate and a gate insulating layer arranged on the gate. A channel corresponding to the gate is formed on the gate insulating layer. The channel includes an oxide semiconductor. The semiconductor oxide includes Zn, In and Hf. The amount of Hf is in the range of about 2-16 at %, inclusive, based on the total amount of Zn, In, and Hf. A source and a drain contact respective sides of the channel.

16 Claims, 20 Drawing Sheets

U.S. PATENT DOCUMENTS

| | | | |
|---|---|---|---|
| 6,727,533 | B2 | 4/2004 | Matsuzaki et al. |
| 6,878,962 | B1 | 4/2005 | Kawasaki et al. |
| 6,929,970 | B2 | 8/2005 | Andriessen et al. |
| 7,061,014 | B2 | 6/2006 | Hosono et al. |
| 7,067,843 | B2 | 6/2006 | Carcia et al. |
| 7,071,122 | B2 | 7/2006 | Saenger et al. |
| 7,145,174 | B2 | 12/2006 | Chiang et al. |
| 7,188,922 | B2 | 3/2007 | Kubo |
| 7,189,992 | B2 | 3/2007 | Wager, III et al. |
| 7,220,635 | B2 | 5/2007 | Brask et al. |
| 7,411,209 | B2 | 8/2008 | Endo et al. |
| 7,456,468 | B2 | 11/2008 | Jeon et al. |
| 2001/0000756 | A1 | 5/2001 | Batra et al. |
| 2002/0146624 | A1 | 10/2002 | Goto et al. |
| 2003/0218221 | A1 | 11/2003 | Wager, III et al. |
| 2004/0038446 | A1 | 2/2004 | Takeda et al. |
| 2004/0069990 | A1 | 4/2004 | Mahajani et al. |
| 2004/0127038 | A1 | 7/2004 | Carcia et al. |
| 2004/0155270 | A1 | 8/2004 | Hoffman |
| 2005/0017244 | A1 | 1/2005 | Hoffman et al. |
| 2005/0039670 | A1 | 2/2005 | Hosono et al. |
| 2005/0062134 | A1 | 3/2005 | Ho et al. |
| 2005/0167668 | A1 | 8/2005 | Korenari et al. |
| 2005/0199959 | A1 | 9/2005 | Chiang et al. |
| 2005/0199960 | A1 | 9/2005 | Hoffman et al. |
| 2005/0258474 | A1 | 11/2005 | Tanaka et al. |
| 2005/0275038 | A1 | 12/2005 | Shih et al. |
| 2006/0003485 | A1 | 1/2006 | Hoffman et al. |
| 2006/0038242 | A1 | 2/2006 | Hsu et al. |
| 2006/0068091 | A1 | 3/2006 | Denda |
| 2006/0079034 | A1 | 4/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0244107 | A1 | 11/2006 | Sugihara et al. |
| 2006/0284172 | A1 | 12/2006 | Ishii |
| 2006/0286737 | A1 | 12/2006 | Levy et al. |
| 2006/0292777 | A1 | 12/2006 | Dunbar |
| 2007/0023750 | A1 | 2/2007 | Chiang et al. |
| 2007/0072439 | A1 | 3/2007 | Akimoto et al. |
| 2007/0184576 | A1 | 8/2007 | Chang et al. |
| 2007/0194379 | A1 | 8/2007 | Hosono et al. |
| 2008/0206923 | A1* | 8/2008 | Kim et al. .................. 438/104 |
| 2008/0315194 | A1 | 12/2008 | Kim et al. |
| 2008/0315200 | A1 | 12/2008 | Kim et al. |

FOREIGN PATENT DOCUMENTS

| | | |
|---|---|---|
| EP | 1 737 044 A1 | 12/2006 |
| JP | A-2004-356196 | 12/2004 |
| JP | A-2005-026465 | 1/2005 |
| JP | 2006-005116 | 1/2006 |
| KR | 10-2005-0092712 | 9/2005 |
| KR | 10-2006-0114469 | 11/2006 |
| WO | WO 2005/088726 | 9/2005 |
| WO | WO 2007/040194 | 6/2008 |

OTHER PUBLICATIONS

International Search Report dated Sep. 25, 2008 for corresponding International Application No. PCT/KR2008/003470.

Office Action mailed Sep. 15, 2009 for co-pending U.S. Appl. No. 12/213,327.

Office Action mailed May 11, 2010 for co-pending U.S. Appl. No. 11/978,581.

Office Action mailed Sep. 12, 2008 for co-pending U.S. Appl. No. 11/898,037.

Office Action mailed Jun. 25, 2009 for co-pending U.S. Appl. No. 11/898,037.

Office Action mailed Mar. 6, 2009 for co-pending U.S. Appl. No. 11/898,037.

Office Action mailed Aug. 20, 2009 for co-pending U.S. Appl. No. 11/785,269.

Office Action mailed Apr. 2, 2010 for co-pending U.S. Appl. No. 12/213,327.

Office Action mailed May 21, 2010 for co-pending U.S. Appl. No. 11/785,269.

International Search Report dated May 21, 2008.

European Search Report dated Aug. 28, 2009.

European Search Report and Written Opinion dated Jun. 16, 2010.

European Search Report and Written Opinion dated Jun. 14, 2010.

* cited by examiner

OXIDE SEMICONDUCTORS AND THIN FILM TRANSISTORS COMPRISING THE SAME

PRIORITY STATEMENT

This application claims priority under 35 U.S.C. §119 to Korean Patent Application No. 10-2008-0050466, filed on May 29, 2008 in the Korean Intellectual Property Office, the entire contents of each of which are incorporated herein by reference.

BACKGROUND

Description of the Related Art

Conventionally, thin film transistors (TFTs) are utilized in various fields of application. For example, TFTs may be used as switching and driving devices in display devices and/or as selective switches in cross-point type memory devices.

While liquid crystal displays (LCDs) have been mainly used as display panels for televisions (TVs), organic light emitting displays (OLEDs) may also be used in TVs. TV display technology is being developed according to market demands. These market demands include larger-sized TVs or digital information displays (DIDs), reduced costs, higher-quality images (e.g., better dynamic image presentation, high definition, relatively high luminosity, improved contrast ratio and color reproduction, etc.). To satisfy these requirements, in addition to fabricating larger-sized substrates (e.g., glass), higher-performance TFTs suitable for use as switching and driving devices for displays may be necessary.

Conventionally, amorphous silicon TFTs (a-Si TFTs) are used as driving and switching devices for displays. Conventional a-Si TFT are devices that may be formed relatively uniformly on substrates greater than about 2 m×2 m in area at relatively low costs and are widely used as driving and switching devices. With recent trends towards larger-sized and higher image quality displays, TFTs require higher performance. But, conventional a-Si TFTs with mobility of about 0.5 $cm^2/Vs$ may be limited in their application. In this regard, higher-performance TFTs with higher mobility than conventional a-Si TFTs and technologies for fabricating such higher-performance TFTs may be needed.

Polycrystalline silicon TFTs (poly-Si TFTs) perform better than a-Si TFTs and have higher mobility. For example, poly-Si TFTs may have a mobility of several tens to several hundreds of $cm^2/Vs$. As a result, poly-Si TFTs may be applied to displays to provide high image quality that cannot be realized by a-Si TFTs. Moreover, the characteristics of poly-Si TFTs degrade less than characteristics of a-Si TFTs. But, process for manufacturing poly-Si TFTs may be more complex than processes for manufacturing a-Si TFTS. This increased complexity may incur additional costs. In short, poly-Si TFTs may be suitable for manufacturing displays with higher image quality and may be applied to products such as OLEDs, but are less cost-effective than a-Si TFTs, and thus are applied restrictively. In addition, due to technological problems associated with poly-Si TFTs (e.g., limits on the manufacturing equipment or lack of uniformity), the formation of poly-Si TFTs on substrates greater than about 1 $m^2$ in area has not been realized. This makes it difficult to apply poly-Si TFTs to larger-sized TV products.

Another example of a TFT suitable for use in displays with higher image quality and applicable to products such as OLEDs are those involving oxide semiconductor devices.

One example of an oxide semiconductor device is ZnO-based TFTs. Conventional ZnO-based materials include, for example, ZnO oxides, Ga—In—Zn oxides, etc. ZnO-based semiconductor devices may be manufactured from an amorphous ZnO-based semiconductor using a relatively low-temperature process, thus enabling easier manufacture of ZnO-based semiconductor devices on larger-sized substrates. A ZnO-based semiconductor, which is a material with relatively high mobility, has electrical properties similar to polycrystalline silicon. Currently, research on applying an oxide semiconductor material layer with relatively high mobility (e.g., a ZnO-based material layer) to a channel region of a TFT has been conducted. The ZnO-based materials include, for example, ZnO materials, Ga—In—Zn oxide materials, etc.

SUMMARY

Example embodiments relate to oxide semiconductors, thin film transistors (TFTS) and methods of manufacturing the same, for example, oxide semiconductors including a Zn oxide to which another material (e.g., Hf) may be added, TFTs including the same and methods of manufacturing the same.

At least one example embodiment provides an oxide semiconductor comprising Zn, In and Hf. The amount of Hf may be in the range of about 2-16 at %, inclusive, based on the total amount of Zn, In, and Hf.

At least one other example embodiment provides an oxide thin film transistor including a gate and a channel formed to correspond to the gate. The channel may include an oxide semiconductor including Zn, In, and Hf. The amount of Hf may be in the range of about 2-16 at %, inclusive, based on the total amount of Zn, In, and Hf. A gate insulator may be formed between the gate and the channel. A source and a drain may contact respective sides of the channel.

According to at least some example embodiments, the oxide semiconductor may be amorphous and the amount of Hf may be in the range of about 3-16 at %, inclusive, based on the total amount of Zn, In, and Hf. In another example, the oxide semiconductor may be amorphous and the amount of Hf may be in the range of about 3.8-11 at %, inclusive, based on the total amount of Zn, In, and Hf. In yet another example, the oxide semiconductor may be amorphous and the amount of Hf may be in the range of about 5-11 at %, inclusive, based on the total amount of Zn, In, and Hf.

According to at least some example embodiments, the amount of Zn may be in the range of about 10-60 at %, inclusive, based on the total amount of Zn, In, and Hf. For example, the amount of Zn may be in the range of about 31-46 at %, inclusive, based on the total amount of Zn, In, and Hf. The amount of In may be in the range of about 30-90 at %, inclusive, based on the total amount of Zn, In, and Hf. For example, the amount of In may be in the range of about 51-54 at %, inclusive, based on the total amount of Zn, In, and Hf.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1A:
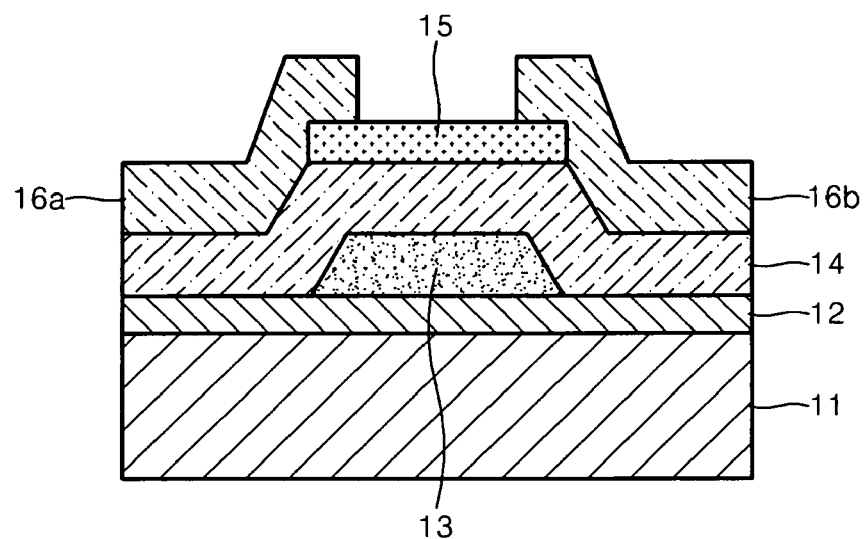
FIG. 1A shows a bottom gate type oxide thin film transistor according to an example embodiment.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Oxide semiconductors, oxide thin film transistors (TFTs) including the same and methods of manufacturing the same according to example embodiments will now be described more fully with reference to the accompanying drawings, in which example embodiments are shown. For reference, the thicknesses and widths of layers shown in the drawings are exaggerated for the purpose of understanding.

Figure 1B:
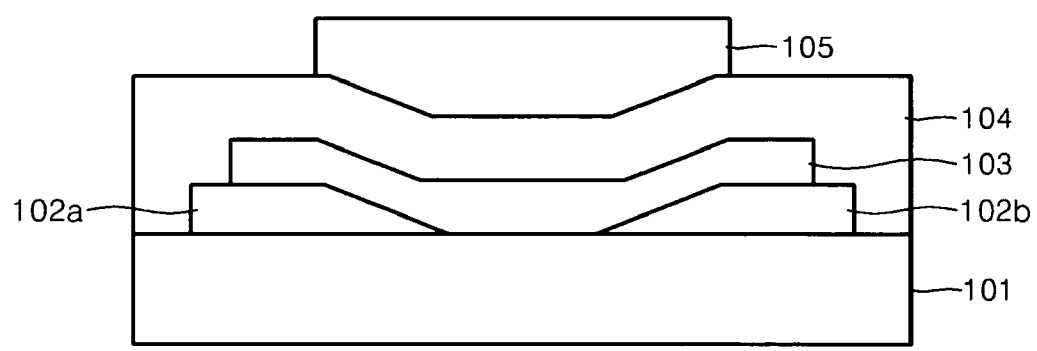
FIG. 1B shows a top gate type thin film transistor according to an example embodiment.

FIGS. 1A and 1B show cross-sectional views of thin film transistors (TFTs) including an oxide semiconductor according to example embodiments. FIG. 1A shows a bottom gate type thin film transistor according to an example embodiment, whereas FIG. 1B shows a top gate type thin film transistor according to an example embodiment. Example embodiments may be equally applicable to both bottom gate type and top gate type thin film transistors.

Referring to FIG. 1A, an oxide TFT according to an example embodiment may include a gate 13 disposed on a substrate 11. A gate insulating layer 14 may be disposed on the substrate 11 and the gate 13. An oxide layer 12 may be formed on the substrate 11. For example, when the substrate 11 is a silicon (Si) substrate, an oxide layer 12 may be a Si oxide formed on the surface of Si using a thermal oxidation or similar process. A channel 15 may be formed on a portion of the gate insulating layer 14 corresponding to the gate 13. A source 16a and a drain 16b may be formed on respective sides of the channel 15 and on the gate insulating layer 14.

In one example, the gate 13 may be formed to have a top surface and two sloping side surfaces (e.g., a trapezoid shaped cross-section, wherein the width of the upper surface is less than the width of the lower surface). The gate insulating layer 14 may be formed to cover upper and side surfaces of the gate 13 and the exposed portion of the upper surface of the oxide layer 12. Although not shown, the oxide layer 12 may be omitted. The width of the channel 15 may correspond to (e.g., be the same or substantially the same as) the width of the lower surface of the gate 13.

Referring to FIG. 1B, according to at least this example embodiment, a source 102a and a drain 102b may be formed on a substrate 101. The source 102a and the drain 102b may be formed apart from one another. A channel 103 may be formed on a portion of the substrate 101 between the source 102a and the drain 102b. A gate insulating layer 104 may be formed on the channel 103. A gate 105 may be formed on the gate insulating layer 104 corresponding to the channel 103. The cross-sectional width of the gate 105 may be less than the cross-sectional width of the channel 103.

In oxide TFTs according to example embodiments, the channels 15 and/or 103 may include an In—Zn composite oxide including Hf.

Materials used to form the above-described layers of the oxide TFT of FIGS. 1A and 1B according to example embodiments will now be described.

The substrates 11 and 101 may be substrates commonly used in semiconductor devices. For example, the substrates 11 and 101 may be formed of Si, glass, an organic or similar material. An insulating layer formed on each of the substrates 11 and 101 may be, for example, a $SiO_2$ layer formed by thermally oxidizing a Si substrate. The gates 13 and 105 may be formed of a conductive material, for example, a metal such as Ti, Pt, Ru, Au, Ag, Mo, Al, W, Cu, or the like or a conductive metal oxide such as IZO (InZnO), AZO (AlZnO), or the like. The gate insulating layers 14 and 104 may be formed of an insulating material commonly used in semiconductor devices. For example, the gate insulating layers 14 and 104 may be formed of, for example, $SiO_2$, a high-k material having a higher dielectric constant than $SiO_2$ (e.g., $HfO_2$, $Al_2O_3$, $Si_3N_4$, a mixture thereof, or the like). Each of the sources 16a and 102a and the drains 16b and 102b may be formed of a conductive material, for example, a metal such as Ti, Pt, Ru, Au, Ag, Mo, Al, W, Cu, or the like or a conductive metal oxide such as IZO (InZnO), AZO (AlZnO) or the like.

An oxide semiconductor according to at least some example embodiments may be an In-Zn composite oxide including Hf.

Hf having electronegativity of about 1.3 may form a relatively strong ionic bond with oxygen having electronegativity of about 3.5 since an electronegativity difference between Hf and O is about 2.2. Hf has an ionic radius of about 0.078 nm which is similar to the ionic radius of Zn, which is about 0.074 nm. Thus, when Hf is added to a Zn oxide or Zn—In composite oxide, Hf may be substituted for Zn more easily and with little or no deformation of crystal lattice of the oxides.

With respect to a-Si:H, a covalent bond may be formed between a-Si and H. When a-Si:H is coordinated with sp3 oxygen having directionality to form an amorphous phase, an electron cloud around oxygen bonds may be distorted resulting in formation of relatively weak bonds. When TFTs having such a weak bonding structure are operated for relatively long periods of time, electrons or holes may accumulate at bonding sites, which may cause bonding states to break, thereby adversely affecting reliability due to a threshold voltage shift. On the other hand, with respect to an ionic bond, electron orbitals may overlap regardless of binding of oxygen an-ions due to a relatively large electron cloud of cat-ions. Thus, the resultant bonding structure may have little or no relatively weak bonds irrespective of whether it is a crystal phase or a non-crystal (e.g., amorphous or similar) phase. As a result, more reliable TFTs may be manufactured. The Zn oxide or the Zn—In composite oxide including Hf according to at least this example embodiment may be mainly formed of ionic groups, but all of the bindings need not be ionic bonds.

According to at least some example embodiments, oxide semiconductors may further include Group I elements such as Li and K, Group II elements such as Mg, Ca and Sr, Group III elements such as Ga, Al, In and Y, Group IV elements such as Ti, Zr, Si, Sn and Ge, Group V elements such as Ta, Vb, Nb and Sb, and Ln series elements such as La, Ce, Pr, Nd, Pm, Sm, Eu, Gd, Tb, Dy, Ho, Er, Tm, Yb and Lu.

Oxide semiconductors according to example embodiments may be employed as a channel material for driving transistors used in LCDs, OLEDs or the like, as a channel material for transistors included in peripheral circuits of memory devices and/or a channel material for selection transistors.

Hereinafter, a method of manufacturing an oxide TFT according to an example embodiment will be described with reference to FIGS. 2A through 2E. The example embodiment of a method of manufacturing will be described with regard to a bottom gate type TFT shown in FIG. 1A. However, it will be understood that a similar process may be used to manufacture a top gate type TFT.

Figure 2A:
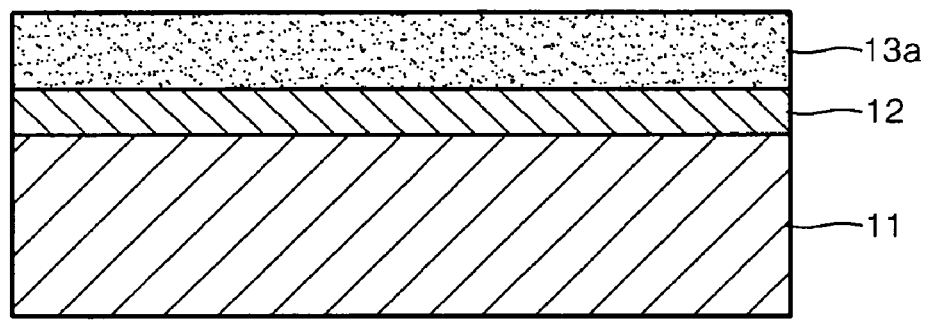
FIGS. 2A to 2E illustrate a method of manufacturing an oxide thin film transistor according to an example embodiment.

Referring to FIG. 2A, a substrate 11 may be prepared. The substrate 11 may be formed of, for example, Si, glass, an organic or similar material. If the substrate 11 is formed of Si, an oxide layer 12 (e.g., $SiO_2$) may be formed on a surface of the substrate 11 using a thermal oxidation or similar process. A conductive material 13a, such as a metal or conductive metal oxide, may be coated on the substrate 11.

Figure 2B:
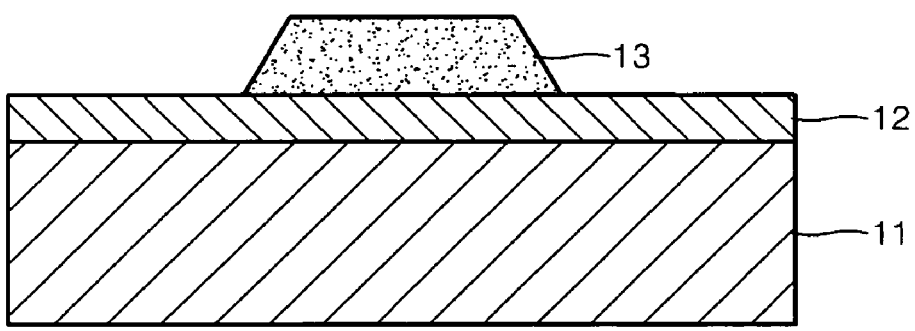

Referring to FIG. 2B, the conductive material 13a may be patterned to form a gate 13.

Figure 2C:
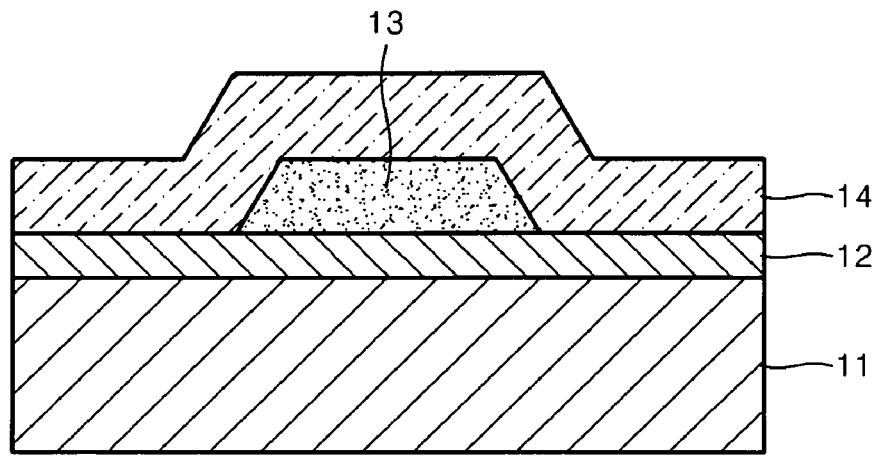

Referring to FIG. 2C, an insulating material may be coated on the gate 13 and patterned to form a gate insulating layer 14. The gate insulating layer 14 may be formed of, for example, a silicon oxide, a silicon nitride, a Hf oxide, an aluminum oxide, a mixture of a Hf oxide and an aluminum oxide or the like.

Figure 2D:
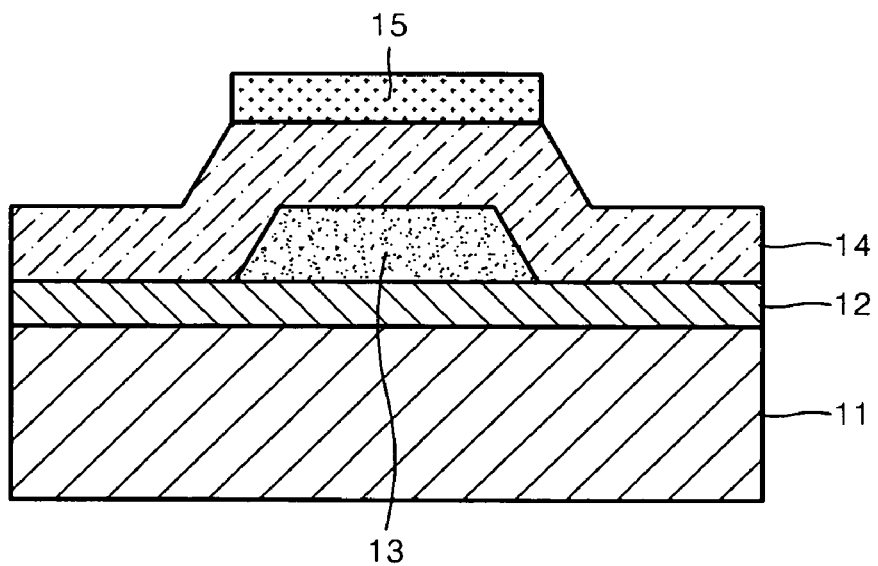

Referring to FIG. 2D, a channel material may be coated on the gate insulating layer 14 using a process such as PVD, CVD, or ALD, and may be patterned to form a channel (or channel region) 15 on a portion of the gate insulating layer 14 corresponding to the gate 13. The channel 15 may be formed by adding Hf to a Zn—In composite oxide. For example, when the channel 15 is formed using sputtering, a single InZnO target including Hf may be loaded in a process chamber and co-sputtered. Alternatively, a single target including ZnO or InZnO and Hf may be used.

Figure 2E:
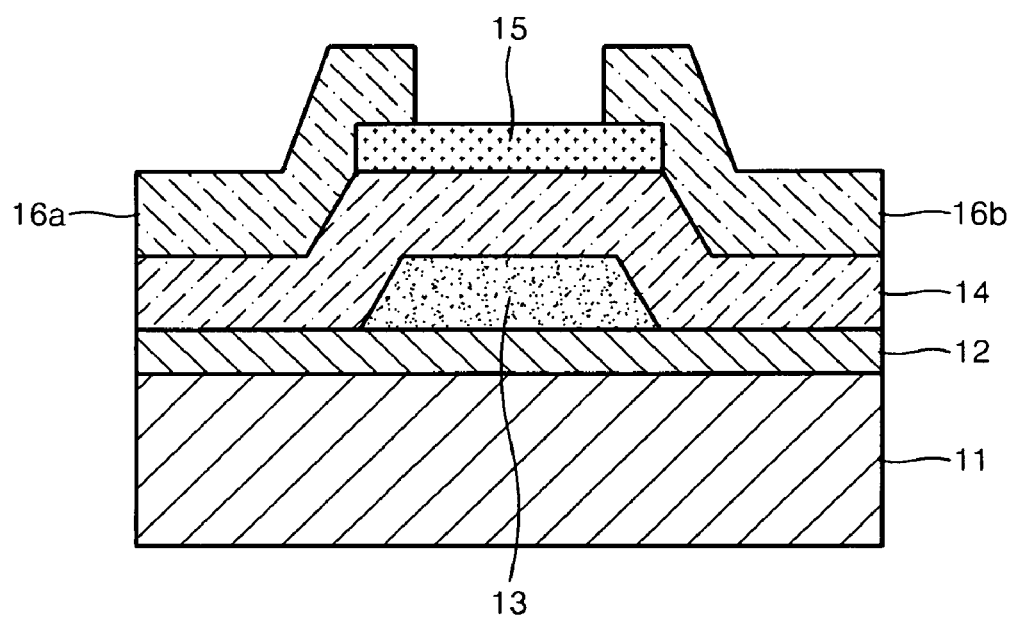

Referring to FIG. 2E, a material such as a metal or conductive metal oxide, may be coated on the channel 15 and the gate insulating layer 14 and may be patterned so that the material connects to each end of the channel 15 to form a source 16a and a drain 16b. The resultant structure may be annealed at about 400° C. or less (e.g., at about 200° C.), using a general furnace, rapid thermal annealing (RTA), laser, a hot plate or the like.

PREPARATION EXAMPLE

A preparation example according to example embodiments will now be described. Still referring to FIGS. 1A-2E, a silicon oxide may be formed as the oxide layer 12 on the surface of a silicon substrate 11. The silicon oxide may be formed to a thickness of about 100 nm. Mo may be deposited on the surface of the substrate 11 to form the gate 13 having a thickness of about 200 nm. A silicon nitride may be coated on the substrate 11 and the gate 13 to form the gate insulating layer 14 having a thickness of about 200 nm. An oxide semiconductor may be coated on the gate insulating layer 14 corresponding to the gate 13 to form the channel 15. A process of forming the channel according to example embodiments will be described in more detail below.

In one example, channels may be formed using single oxide targets formed of $HfO_2:In_2O_3:ZnO$ (0.1:1:2 mol % (target 1), 0.2:1:2 mol % (target 2), 0.3:1:2 mol % (target 3), and 0.4:1:2 mol % (target 4)). Each of the targets 1 to 4 may be loaded in a chamber for sputtering. RF magnetron sputtering of the target may be performed by applying about 150 W to the target while the pressure of the chamber is maintained at about 5 mTorr by supplying Ar and $O_2$ in a ratio of between about 90 to 95 sccm: 5 to 10 sccm, inclusive, to the sputter at room temperature (e.g., in the range of about 15° C. to about 30° C.). In utilizing this example embodiment, the channel may have a thickness of about 70 nm and a width/length (W/L) ratio of 50/4 μm. Mo may be formed on each side of the channel as a source and a drain having a thickness of about 200 nm. A Si oxide may be formed thereon as a passivation layer having a thickness of about 200 nm. The resultant may be thermally treated at about 200° C. for about 1 hour.

Transmission electron microscope (TEM) images and diffraction patterns of each region of an oxide semiconductor according to an example embodiment were measured to identify accurate phase of the regions.

FIGS. 3A to 3D are TEM images of samples of oxide semiconductors prepared according to example embodiments.

Figure 3A:
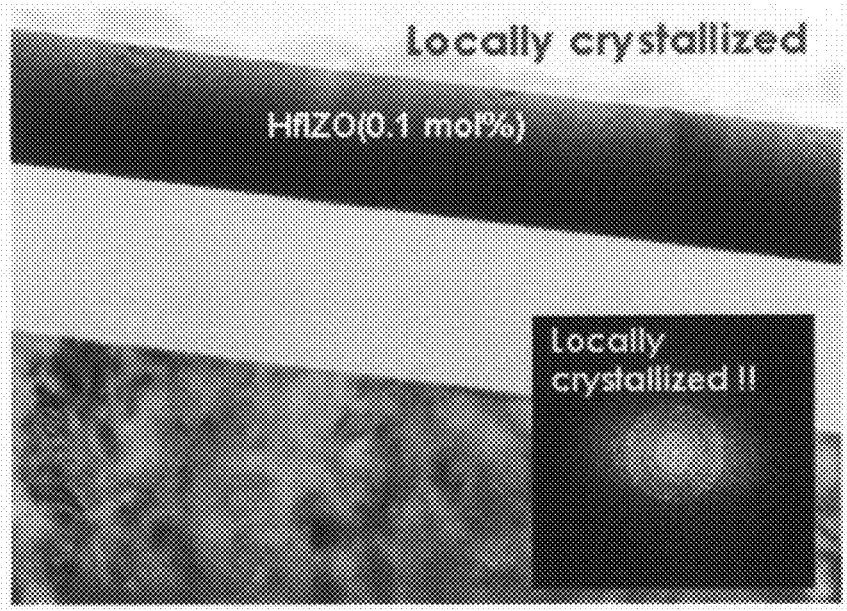
FIGS. 3A to 3D are transmission electron microscope (TEM) images of samples of an oxide semiconductor prepared according to an example embodiment.

Referring to FIG. 3A, in a sample formed using above-discussed target 1, a crystalline phase is observed in a portion, whereas an amorphous phase is observed in other (e.g., most other) regions of the thin film.

Figure 3B:
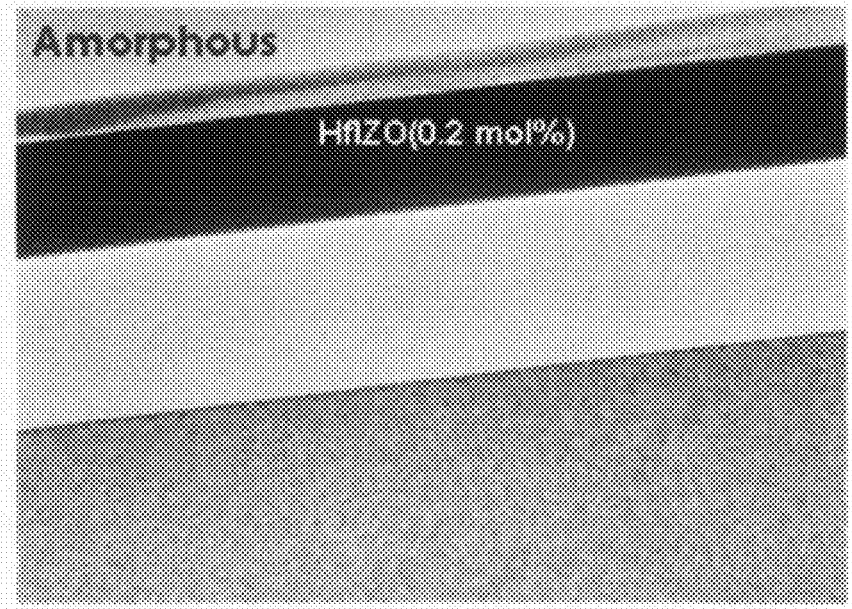
Figure 3C:
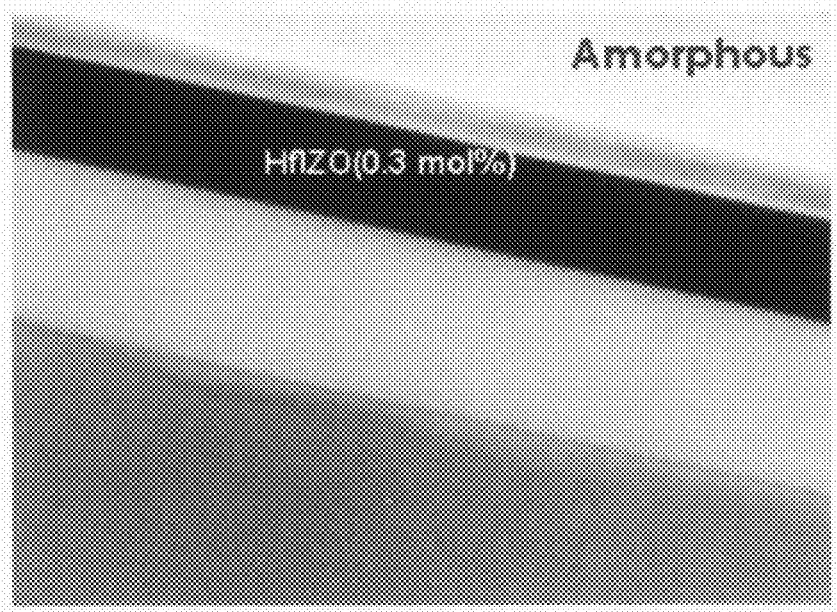
Figure 3D:
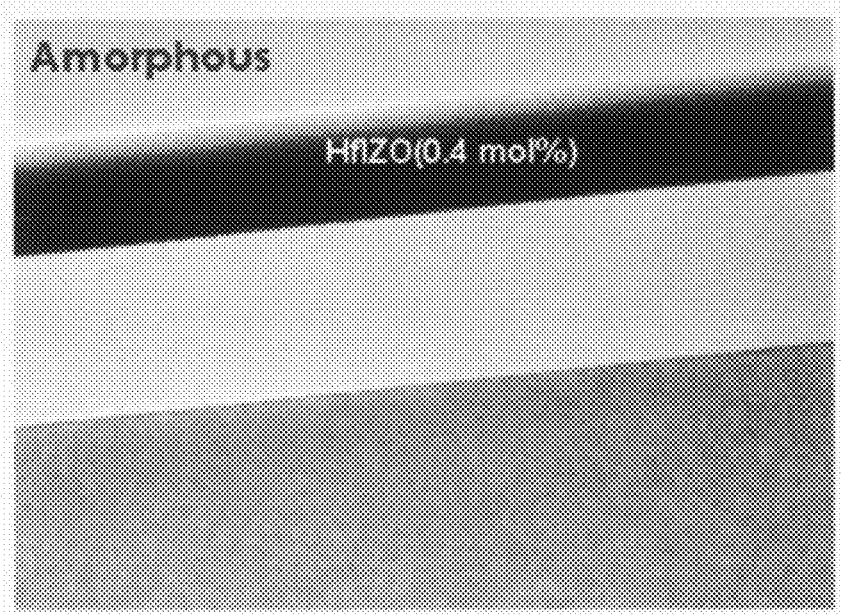

Referring to FIGS. 3B to 3D, in samples formed using above-discussed targets 2 to 4, an amorphous phase is observed substantially uniformly in regions of the thin film, which is different from the sample of FIG. 3A in which the thin film has partially crystallized grain regions. The composition of the samples formed using targets 1 to 4 was respectively evaluated using Inductively Coupled Plasma (ICP)-Auger Electron Spectroscopy (AES) analysis. Atomic ratios of Zn, In, and Hf in the samples formed using targets 1 to 4 are shown in Table 1 below.

TABLE 1

|  | Zn/(Zn + In + Hf) atomic % | In/(Zn + In + Hf) atomic % | Hf/(Zn + In + Hf) atomic % |
| --- | --- | --- | --- |
| Target 1 | 46 | 52 | 2 |
| Target 2 | 42 | 54 | 5 |
| Target 3 | 39 | 54 | 7 |
| Target 4 | 41 | 52 | 7 |

The ICP analysis results shown in Table 1 and described hereinafter are rounded off to one decimal place and the error range is ±1%.

In another example, channels may be formed using single oxide targets formed of $HfO_2:In_2O_3:ZnO$ (0.1:1:2 mol % (target 5), 0.2:1:2 mol % (target 6), 0.3:1:2 mol % (target 7), and 0.4:1:2 mol % (target 8)). Each of the targets 5 to 8 may be loaded in a chamber of a sputter. Channels may be formed of the targets 5 to 8 using DC sputtering by supplying $Ar:O_2$ gases in a ratio of about 95:5 sccm, inclusive, to the sputter. The channels may be thermally treated at about 200° C. in a $N_2$ atmosphere for about 1 hour.

Compositions of samples formed using targets 5 to 8 as described above were evaluated using ICP-AES analysis. Atomic ratios of Zn, In, and Hf in the samples formed using targets 5 to 8 are shown in Table 2 below.

TABLE 2

|  | Zn/(Zn + In + Hf) atomic % | In/(Zn + In + Hf) atomic % | Hf/(Zn + In + Hf) atomic % |
| --- | --- | --- | --- |
| Target 5 | 42 | 52 | 5 |
| Target 6 | 38 | 51 | 11 |
| Target 7 | 34 | 52 | 14 |
| Target 8 | 31 | 53 | 16 |

In yet another example, a channel may be formed using a target formed of $HfO_2:In_2O_3:ZnO$ (0.15:1:2 mol % (target 9)). The target 9 may be loaded in a chamber of a sputter, and DC sputtering may be performed by supplying $Ar:O_2$ gases in a ratio of about 90:10 sccm to the sputter. The resultant may be thermally treated at about 200° C. for about 1 hour. In the results of ICP analysis of an example formed using this process, the amount of Hf was about 3.8 at %.

Figure 4A:
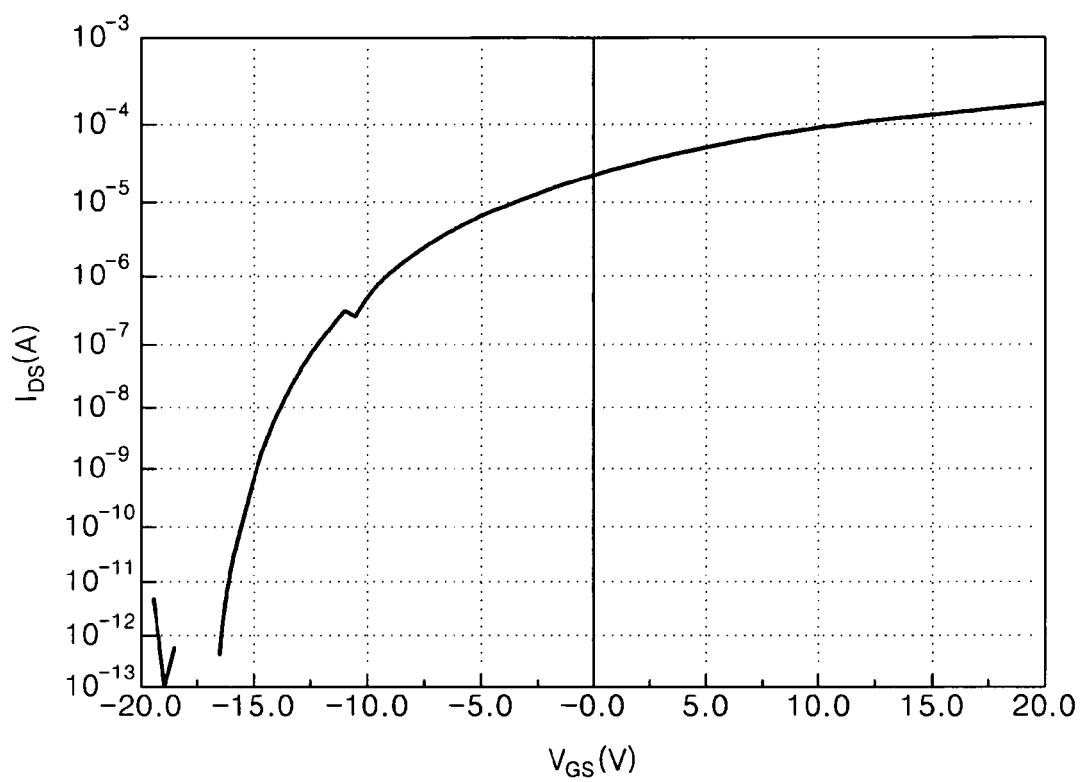
FIGS. 4A to 4D show graphs of drain current $I_{DS}$ versus gate voltage $V_{GS}$ of an oxide thin film transistor according to an example embodiment; the graphs illustrate transfer curves according to the amount of Hf of a channel region of the oxide thin film transistor.
Figure 4B:
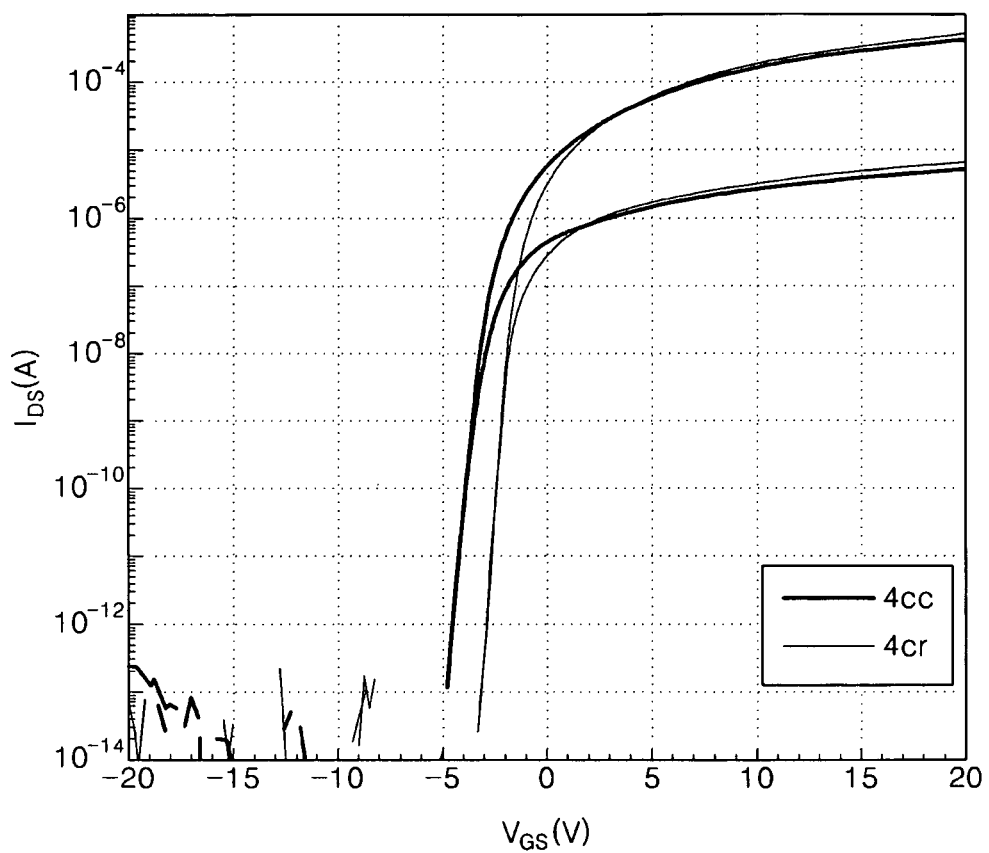
Figure 4C:
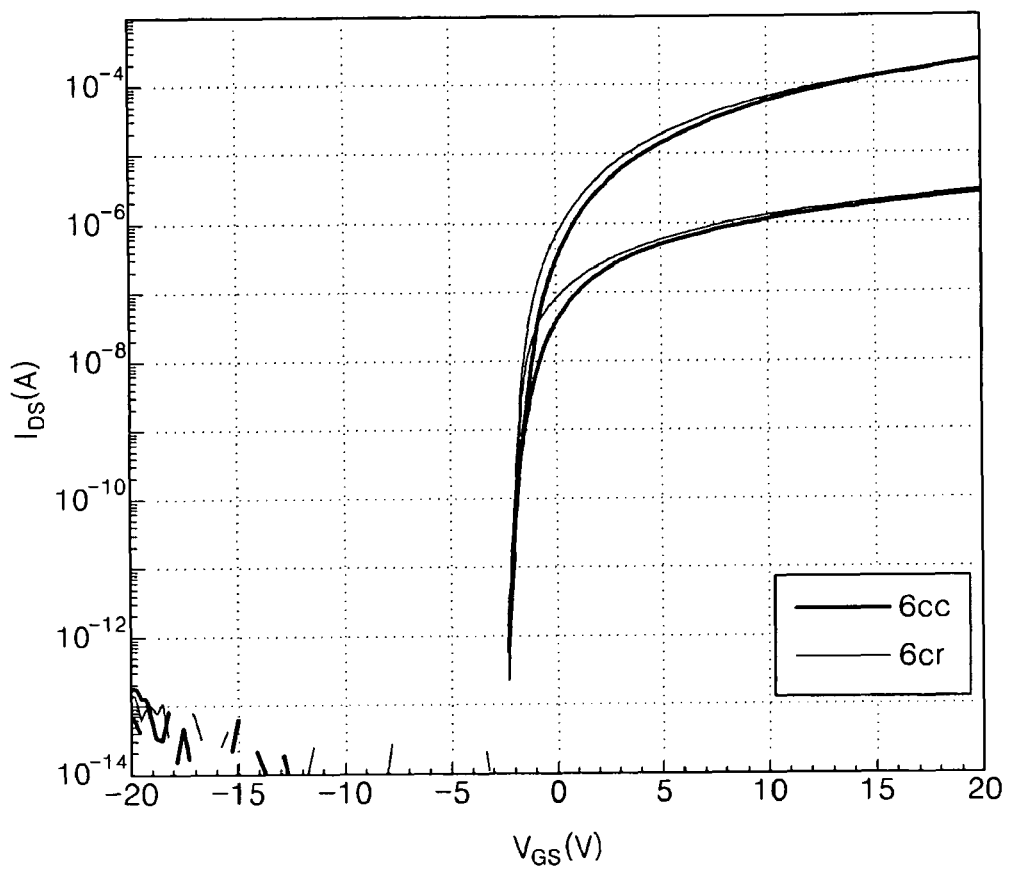
Figure 4D:
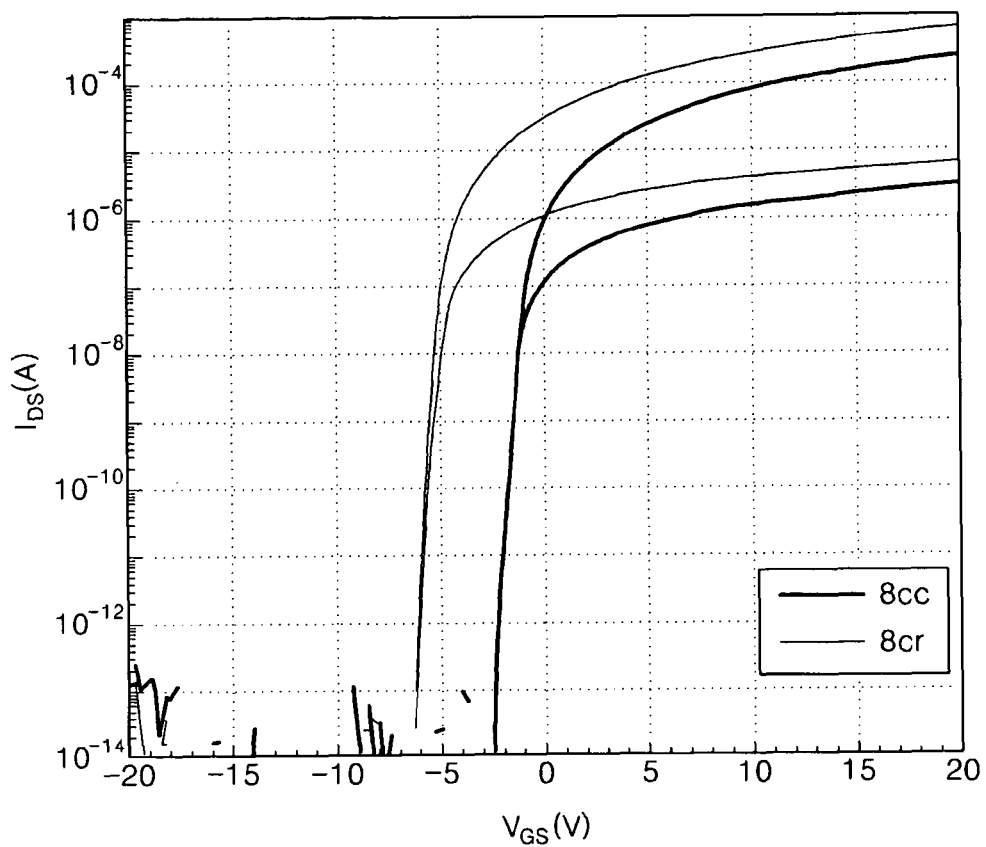

FIGS. 4A to 4D show graphs of drain current $I_{DS}$ versus gate voltage $V_{GS}$ of an oxide thin film transistor according to an example embodiment when a source-drain voltage is 10 V. The graphs show transfer curves according to the amount of Hf of a channel region (width:length=50:4 μm) of the oxide thin film transistor. FIGS. 4B, 4C, and 4D also show graphs of drain current $I_{DS}$ versus gate voltage $V_{GS}$ when a source-drain voltage is 0.1 V, and a curve indicating an On current of about $10^{-6}$ A is added. The "cc" indicates that the center of the samples is measured, and the "cr" indicates that the verge of the samples is measured.

FIG. 4A shows a graph of a channel formed of target 1 by supplying $Ar:O_2$ in a ratio of 90:10 sccm. FIG. 4B shows a graph of a channel formed of target 2 by supplying $Ar:O_2$ in a ratio of 90:10 sccm. FIG. 4C shows a graph of a channel formed of target 3 by supplying $Ar:O_2$ in a ratio of 90:10 sccm. FIG. 4D shows a graph of a channel formed of target 4 by supplying $Ar:O_2$ in a ratio of 90:10 sccm. Referring to FIGS. 4A to 4D, an On current is about $10^{-5}$-$10^{-3}$ A, an Off current is less than or equal to $10^{-12}$ A, and an On/Off current ratio is greater than or equal to $10^7$, when the source-drain voltage is 10 V.

Figure 5A:
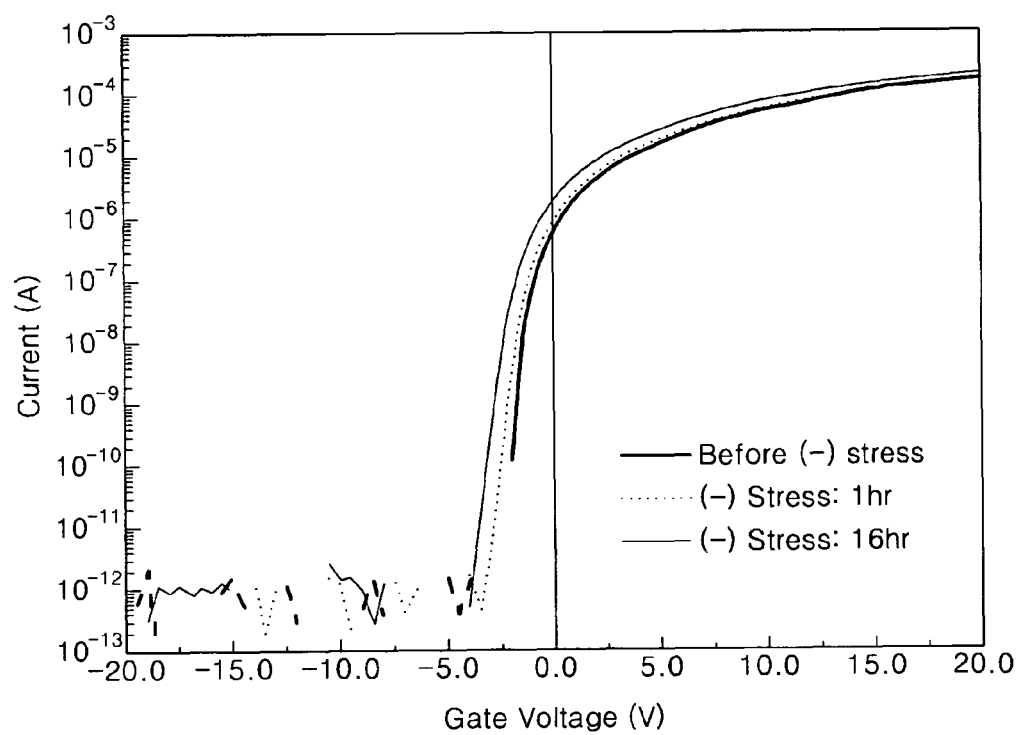
FIG. 5A shows a graph of transfer curves of an example embodiment of an oxide thin film transistor prepared by forming a channel region using target 3 (a $HfO_2:In_2O_3:ZnO$ target having a ratio of 0.3:1:2 mol %) in a $Ar:O_2$ ratio of 90:10 sccm, thermally treating the channel at 200° C., and applying a gate-source voltage of −20 V and a drain-source voltage of 10 V to the resultant structure at 60° C. for 1 hour and 16 hours.

FIG. 5A shows a graph of transfer curves of an oxide thin film transistor prepared by forming a channel region (width: length=50:4 μm) using target 3 in a $Ar:O_2$ ratio of 90:10 sccm, thermally treating the channel at about 200° C. for about 15 hours, and applying a gate-source voltage of −20 V and a drain-source voltage of 10 V to the resultant structure at about 60° C. for about 1 hour and about 16 hours.

Referring to FIG. 5A, the transfer curves are almost constant (or substantially constant). As a result, one can appreciate that a more reliable semiconductor device may be manufactured.

Figure 5B:
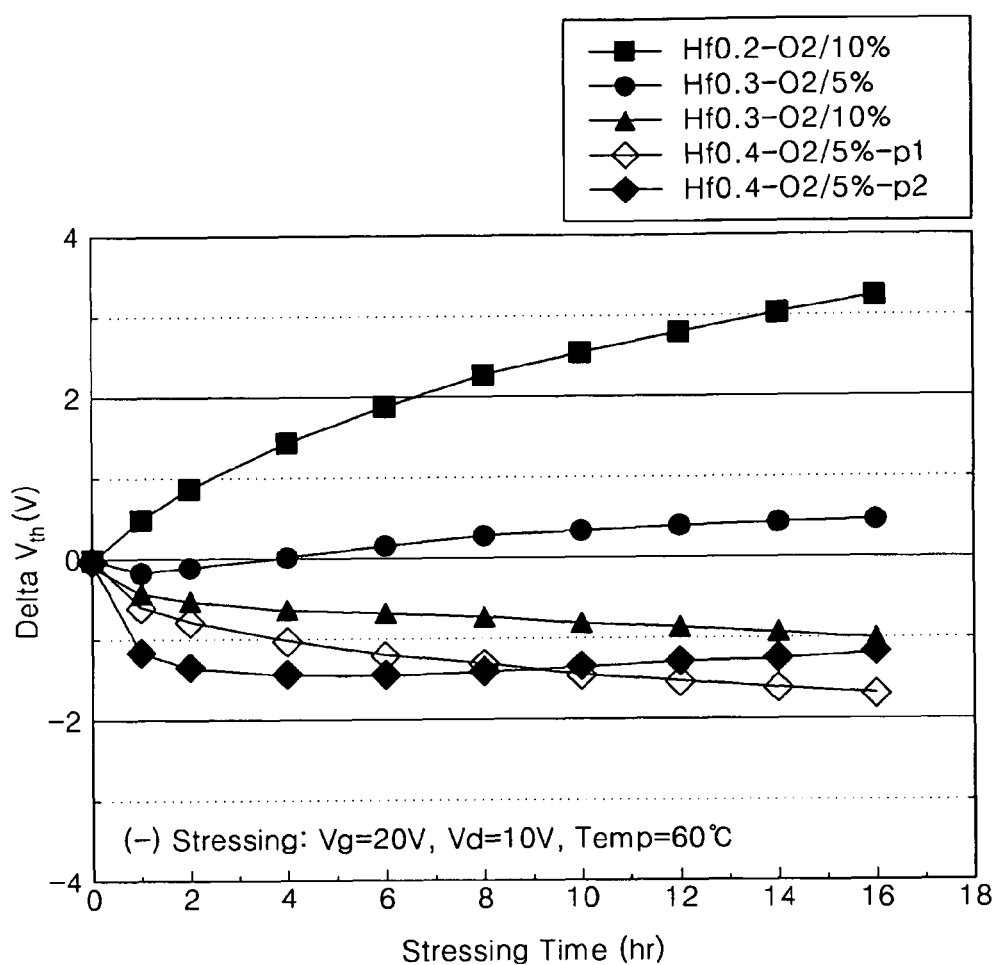
FIG. 5B shows a graph of variations of $V_{th}$ ($\Delta V_{th}$) at $10^{-9}$ A after forming channel regions using targets 2 to 4 ($HfO_2:In_2O_3:ZnO$ having ratios of 0.2:1:2 mol % (target 2), 0.3:1:2 mol % (target 3), and 0.4:1:2 mol % (target 4)) and measuring transfer curves.

FIG. 5B shows a graph of variations on $V_{th}$ ($\Delta V_{th}$) over time at $10^{-9}$ A after forming channel regions (width:length=50:4 μm) using targets 2 to 4 in a $Ar:O_2$ ratio of 90:10 sccm, thermally treating the channel at about 200° C. for about 15 hours, and measuring transfer curves. Referring to FIG. 5B, $\Delta V_{th}$ of most of the samples is relatively low. For example, the sample formed using target 3 has relatively high reliability due to relatively low (e.g., very low) $\Delta V_{th}$ values.

FIGS. 6A to 6D show graphs of drain current $I_{DS}$ versus gate voltage $V_{GS}$ of oxide thin film transistors according to example embodiments when a source-drain voltage is 10 V after forming channel regions (width:length=50:4 μm) using targets 5, 6, 7, and 8 in a $Ar:O_2$ ratio of 90:10 sccm using DC sputtering, and thermally treating the channel at about 200° C. in a nitrogen atmosphere for about 1 hour.

Figure 6A:
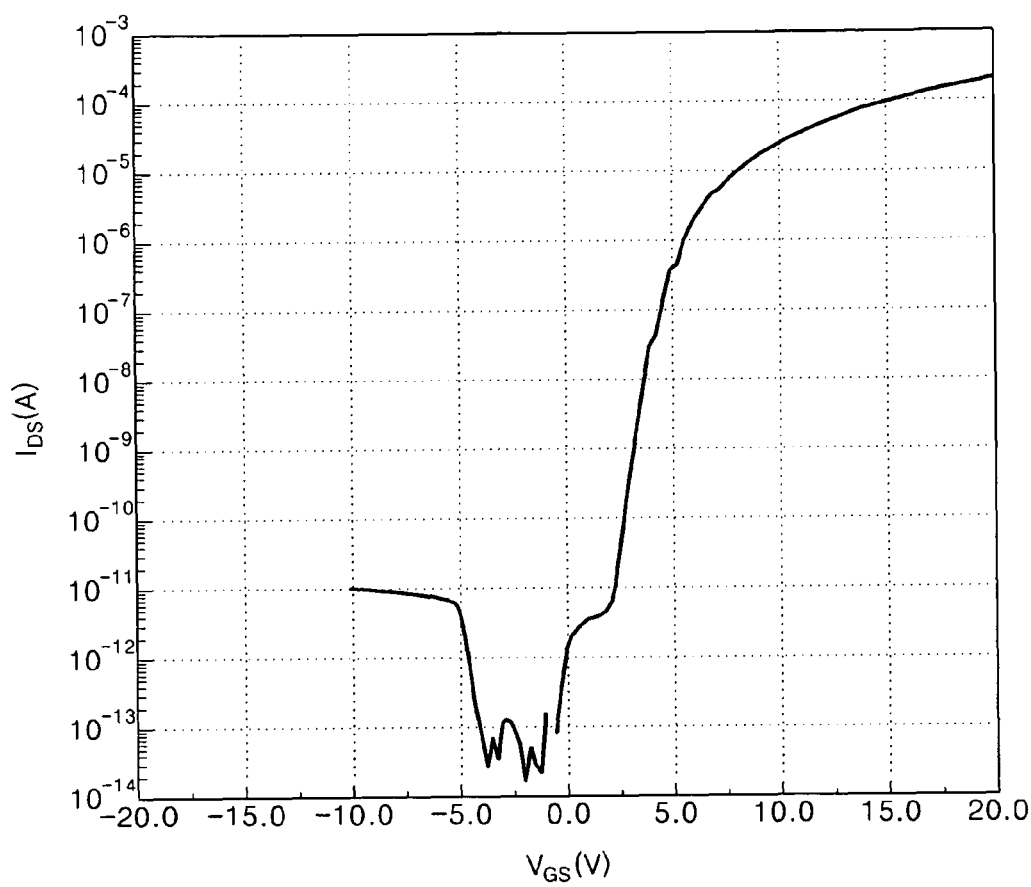
FIGS. 6A to 6D show graphs of drain current $I_{DS}$ versus gate voltage $V_{GS}$ of an oxide thin film transistor according to an example embodiment when a source-drain voltage is 10 V after forming channel regions (width:length=50 μm:4 μm) using targets 5, 6, 7, and 8 ($HfO_2:In_2O_3:ZnO$ having ratios of 0.1:1:2 mol % (target 5), 0.2:1:2 mol % (target 6), 0.3:1:2 mol % (target 7), and 0.4:1:2 mol % (target 8)) in an $Ar:O_2$ ratio of 90:10 sccm using a DC sputtering, and thermally treating the channel at 200° C. in a nitrogen atmosphere for 1 hour.
Figure 6B:
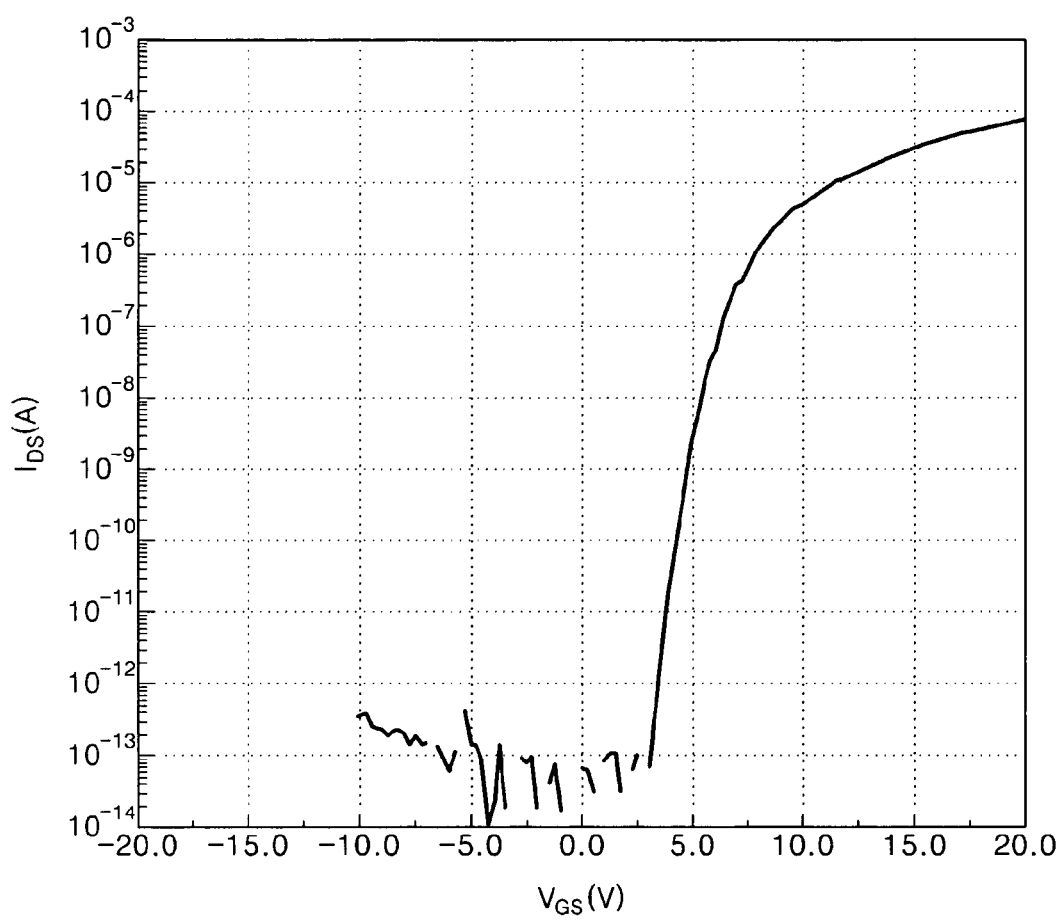
Figure 6C:
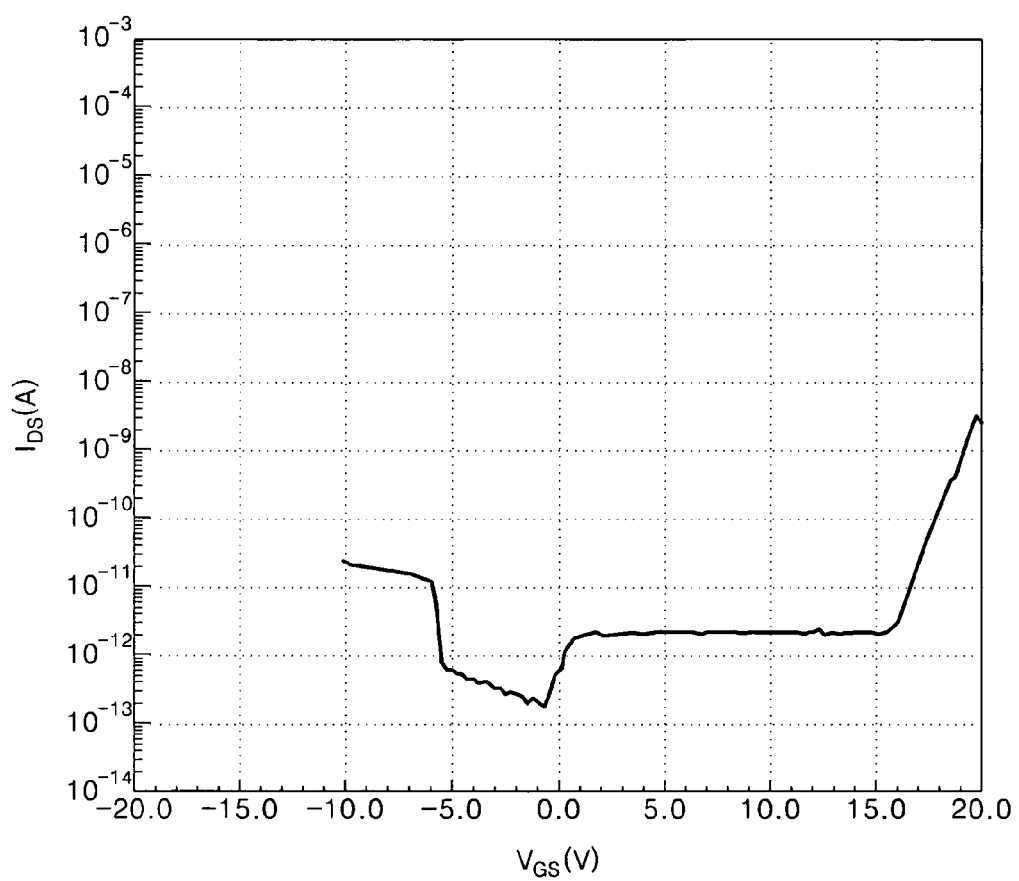
Figure 6D:
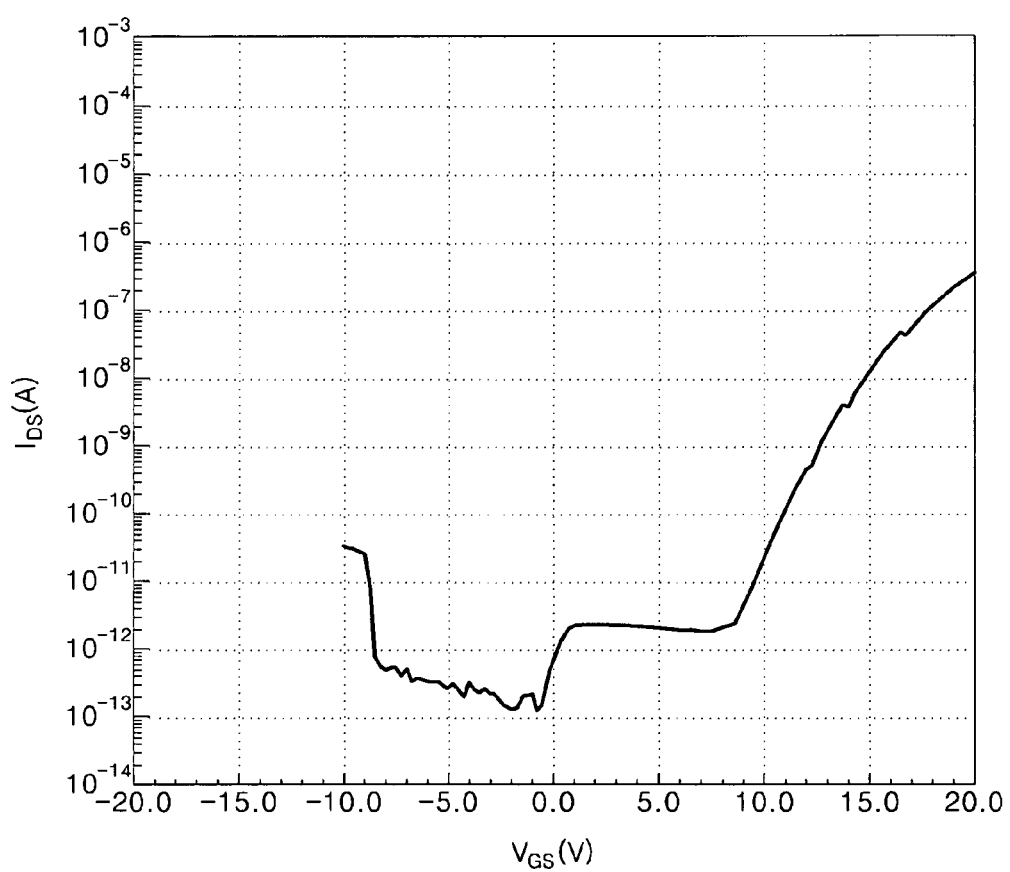

Referring to FIGS. 6A and 6B, an On current is about $10^{-4}$ A, an Off current is less than or equal to $10^{-12}$-$10^{-11}$ A, and an On/Off current ratio is greater than or equal to $10^7$ when the amount of Hf is about 5 and 11 at %. In addition, FIGS. 6C and 6D show that the channels may be available for TFTs at a relatively high voltages greater than or equal to about 5 V.

Figure 7A:
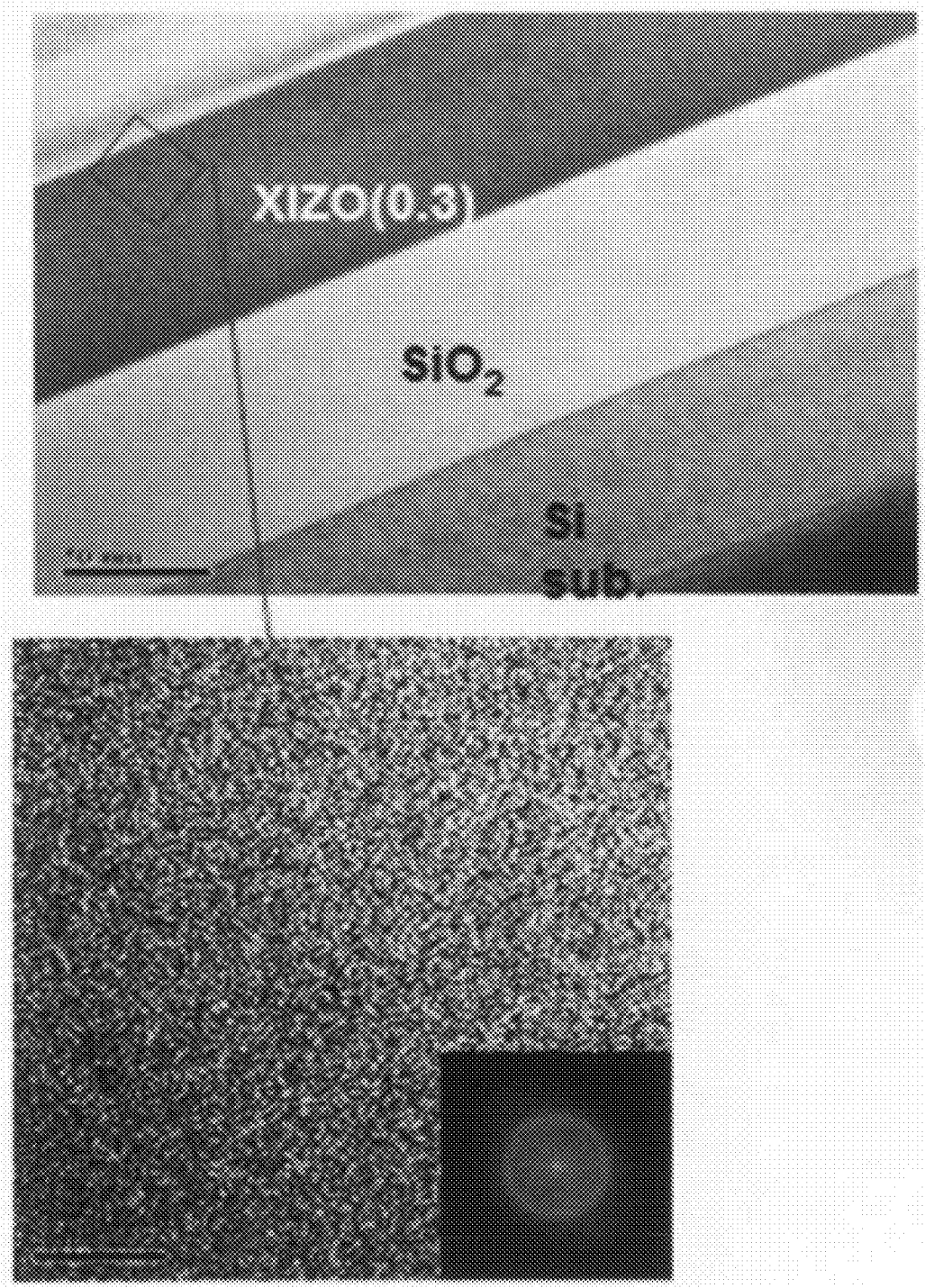
FIGS. 7A and 7B show TEM images of channel regions of samples formed using targets 7 and 8.
Figure 7B:
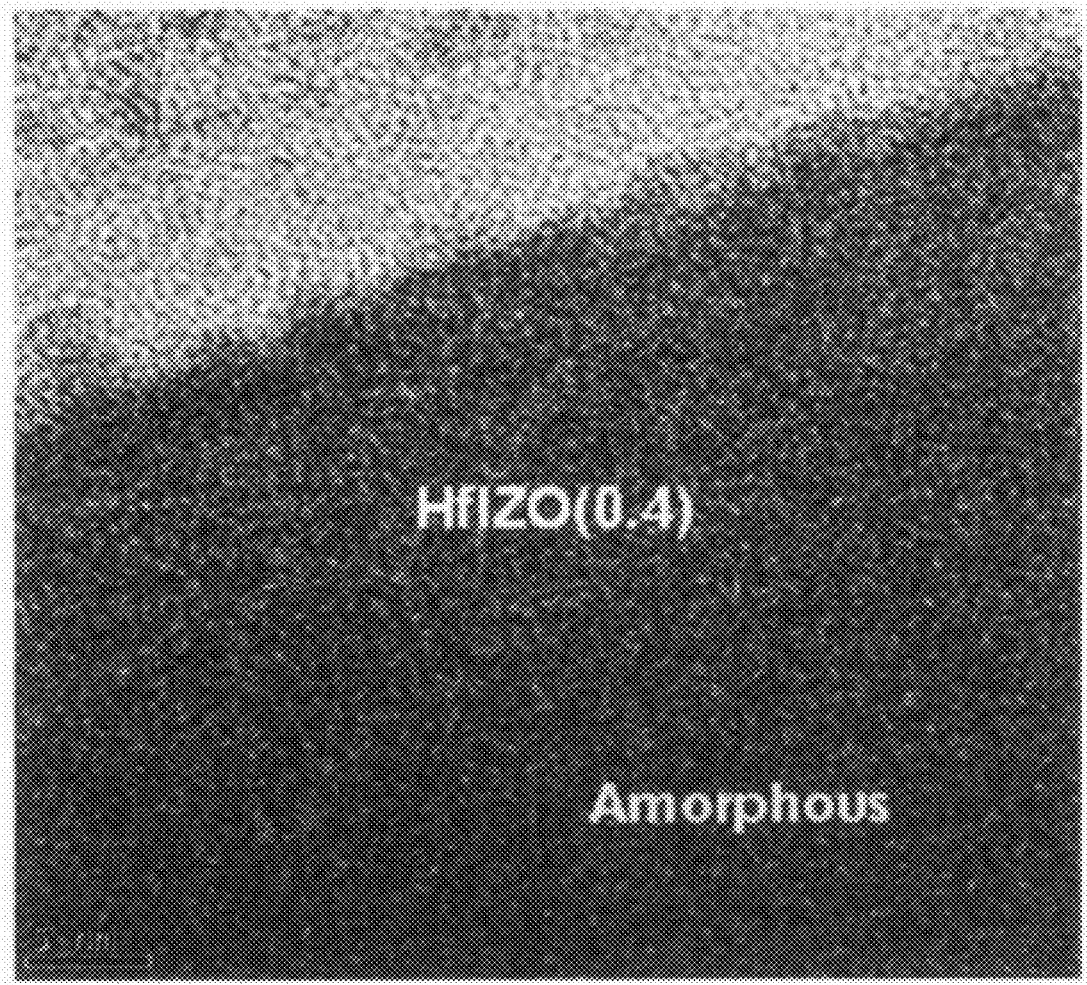

FIGS. 7A and 7B show TEM images of channel regions of samples formed using targets 7 and 8. Referring to FIGS. 7A and 7B, the channel regions formed using targets 7 and 8 have amorphous characteristics.

Figure 8:
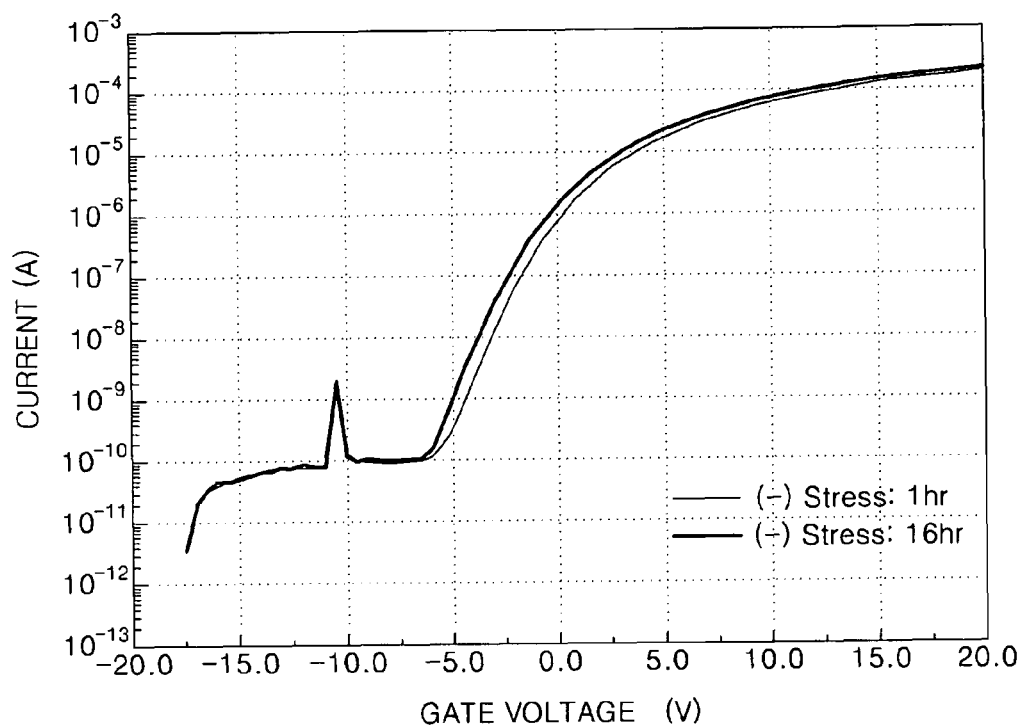
FIG. 8 shows a graph of transfer curves of an oxide thin film transistor according to an example embodiment prepared by forming a channel region (width:length=50 μm:4 μm) using target 6 in an $Ar:O_2$ ratio of 90:10 sccm, thermally treating the channel at 200° C. in a nitrogen atmosphere for 1 hour, and applying a gate-source voltage of −20 V and a drain-source voltage of 10 V to the resultant structure at 60° C. for 1 hour and 16 hours.

FIG. 8 shows a graph of transfer curves of an oxide thin film transistor according to an example embodiment prepared by forming a channel region (width:length=50:4 µm) using target 6 in an Ar:$O_2$ ratio of 90:10 sccm, thermally treating the channel at about 200° C. in a nitrogen atmosphere for about 1 hour, and applying a gate-source voltage of −20 V and a drain-source voltage of 10 V to the resultant structure at about 60° C. for about 1 hour and about 16 hours. Referring to FIG. 8, the transfer curves are almost constant (or substantially constant).

Figure 9:
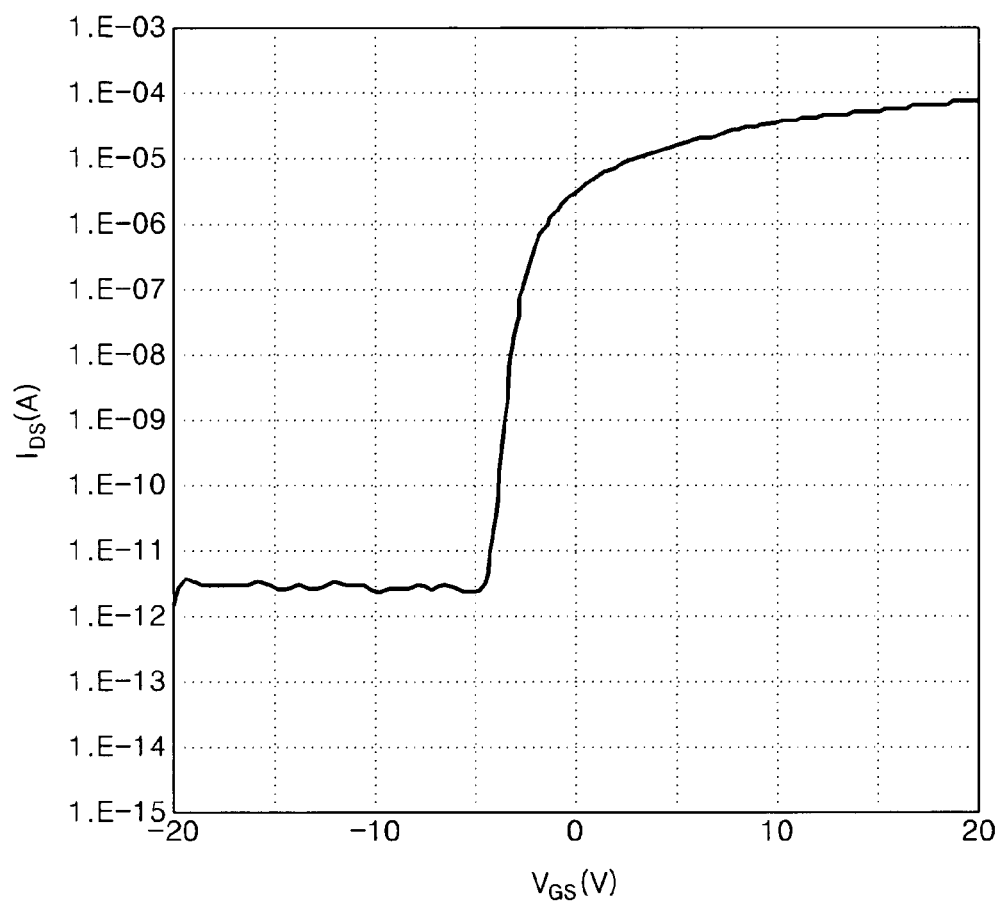
FIG. 9 shows a graph of drain current $I_{DS}$ versus gate voltage $V_{GS}$ of an oxide thin film transistor according to an example embodiment illustrating transfer curves measured after forming a channel region (width:length=50 μm:4 μm) using target 9 ($HfO_2:In_2O_3:ZnO$ having a ratio of 0.15:1:2 mol %) and thermally treating the channel at 200° C. in a nitrogen atmosphere for 1 hour.

FIG. 9 shows a graph of drain current $I_{DS}$ versus gate voltage $V_{GS}$ of an oxide thin film transistor according to an example embodiment. The graph in FIG. 9 illustrates transfer curves measured after forming a channel region (width:length=50:4 µm) using target 9 and thermally treating the channel at about 200° C. in a nitrogen atmosphere for about 1 hour.

Referring to FIG. 9, an On current is about $10^{-4}$ A, an Off current is less than or equal to $10^{-12}$-$10^{-11}$ A, and an On/Off current ratio is greater than or equal to $10^7$. As a result, oxide thin film transistors according to at least some example embodiments have a relatively high On/Off current ratio and a relatively low Off current, and thus may be suitable for a transistor.

In oxide semiconductors according to example embodiments, the amount of Hf may be in the range of about 2-16 at %, inclusive, based on the total amount of Zn, In, and Hf. In this regard, the amount of Zn may be in the range of about 10-60 at %, inclusive, and the amount of In may be in the range of about 30-90 at %, inclusive. For example, the amount of Zn may be in the range of about 31-46 at %, inclusive. The amount of In may be in the range of about 51-54 at %, inclusive. If the amount of Hf is greater than or equal to about 3 at %, the oxide semiconductor may be considered amorphous, whereas if the amount of Hf is less than about 3 at %, the oxide semiconductor may be considered to be in a phase including microcrystals.

In oxide thin film transistors according to example embodiments, the composition of the deposited thin film and $I_{DS}$-$V_{GS}$ graph may vary according to the type of the target, voltage applied to the target, deposition equipment, deposition pressure, oxygen partial pressure, temperature of substrate, or the like. Furthermore, even when the composition of the deposited thin film is the same or substantially the same, properties of the thin film may be changed. For example, when the oxide semiconductor is deposited using sputtering, the resistance range may be largely changed according to oxygen partial pressure. If the oxygen partial pressure is controlled to be less than a certain level, the deposited thin film may have a relatively low resistance. If the oxygen partial pressure is controlled to be greater than a certain level, the deposited thin film may have a relatively high resistance.

It will be understood by those of ordinary skill in the art that an oxide semiconductor according to the present invention may be applicable to or suitable for various electronic devices such as driving transistors of flat panel displays (e.g., LCDs, OLEDs or the like) and/or transistors included in peripheral circuits of memory devices. Oxide thin film transistors according to example embodiments may be bottom gate-type or top gate-type transistors.

According to example embodiments, the ranges of values set forth herein are meant to be inclusive, whether or not explicitly indicated as such. Consequently, ranges of values designated as, for example, in the range of about 2-16 at % may include values equal or substantially equal to 2 and values equal or substantially equal to 16 in addition to the values between 2 and 16.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. An oxide semiconductor comprising Zn, In and Hf, an amount of Hf being in the range of about 2-16 at %, inclusive, based on a total amount of Zn, In, and Hf.

2. The oxide semiconductor of claim 1, wherein a structure of the oxide semiconductor is amorphous and the amount of Hf is in the range of about 3-16 at %, inclusive, based on the total amount of Zn, In, and Hf.

3. The oxide semiconductor of claim 1, wherein a structure of the oxide semiconductor is amorphous and the amount of Hf is in the range of about 3.8-11 at %, inclusive, based on the total amount of Zn, In, and Hf.

4. The oxide semiconductor of claim 1, wherein a structure of the oxide semiconductor is amorphous and the amount of Hf is in the range of about 5-11 at %, inclusive, based on the total amount of Zn, In, and Hf.

5. The oxide semiconductor of claim 1, wherein an amount of Zn is in the range of about 10-60 at %, inclusive, based on the total amount of Zn, In, and Hf.

6. The oxide semiconductor of claim 1, wherein an amount of Zn is in the range of about 31-46 at %, inclusive, based on the total amount of Zn, In, and Hf.

7. The oxide semiconductor of claim 1, wherein an amount of In is in the range of about 30-90 at %, inclusive, based on the total amount of Zn, In, and Hf.

8. The oxide semiconductor of any one of claim 1, wherein an amount of In is in the range of about 51-54 at %, inclusive, based on the total amount of Zn, In, and Hf.

9. An oxide thin film transistor comprising:
a gate;
a channel formed to corresponding the gate, the channel comprising Zn, In and Hf, an amount of Hf being in the range of about 2-16 at %, inclusive, based on a total amount of Zn, In, and Hf;
a gate insulating layer formed between the gate and the channel; and
a source and a drain contacting respective sides of the channel.

10. The oxide thin film transistor of claim 9, wherein the amount of Hf is in the range of about 3-16 at %, inclusive, based on the total amount of Zn, In, and Hf in the channel, and the oxide semiconductor is amorphous.

11. The oxide thin film transistor of claim 9, wherein the amount of Hf is in the range of about 3.8-11 at %, inclusive, based on the total amount of Zn, In, and Hf in the channel, and the oxide semiconductor is amorphous.

12. The oxide thin film transistor of claim 9, wherein the amount of Hf is in the range of about 5-11 at %, inclusive, based on the total amount of Zn, In, and Hf in the channel, and the oxide semiconductor is amorphous.

13. The oxide thin film transistor of claim 9, wherein an amount of Zn is in the range of about 10-60 at %, inclusive, based on the total amount of Zn, In, and Hf.

14. The oxide thin film transistor of claim 9, wherein an amount of Zn is in the range of about 31-46 at %, inclusive based on the total amount of Zn, In, and Hf.

15. The oxide thin film transistor of claim 9, wherein an amount of In is in the range of about 30-90 at %, inclusive, based on the total amount of Zn, In, and Hf.

16. The oxide thin film transistor of claim 9, wherein an amount of In is in the range of about 51-54 at %, inclusive, based on the total amount of Zn, In, and Hf.

* * * * *